United States Patent

Srivastava et al.

[11] Patent Number: 6,057,645
[45] Date of Patent: May 2, 2000

[54] PLASMA DISCHARGE DEVICE WITH DYNAMIC TUNING BY A MOVABLE MICROWAVE TRAP

[75] Inventors: Aseem K. Srivastava, Gaithersburg; Richard E. Pingree, New Market; Victor Pellicier, Monrovia, all of Md.

[73] Assignee: Eaton Corporation, Cleveland, Ohio

[21] Appl. No.: 09/001,635

[22] Filed: Dec. 31, 1997

[51] Int. Cl.[7] .................................................. H01J 7/46
[52] U.S. Cl. ..................................... 315/111.21; 156/345
[58] Field of Search ............ 315/111.21; 118/723 MW, 118/723 ME, 723 AN; 156/345 C, 345 MW

[56] References Cited

U.S. PATENT DOCUMENTS

| | | | |
|---|---|---|---|
| 3,577,207 | 5/1971 | Kirjushin | 315/39 |
| 4,207,452 | 6/1980 | Arai | 219/10.55 A |
| 4,507,588 | 3/1985 | Asmussen | 315/39 |
| 4,611,108 | 9/1986 | Leprince et al. | 315/111.21 X |
| 4,630,566 | 12/1986 | Asmussen et al. | 315/111.41 |
| 4,691,662 | 9/1987 | Roppel et al. | 118/723 X |
| 4,866,346 | 9/1989 | Gandreau et al. | 315/111.21 |
| 4,943,345 | 7/1990 | Asmussen et al. | 156/345 X |
| 5,038,713 | 8/1991 | Kawakami et al. | 156/345 X |
| 5,063,329 | 11/1991 | Okamoto | 315/111.21 |
| 5,069,928 | 12/1991 | Echizen et al. | 315/111.21 X |
| 5,078,823 | 1/1992 | Chollet et al. | 156/345 MW |
| 5,082,517 | 1/1992 | Moslehi | 156/345 |
| 5,201,994 | 4/1993 | Nonaka et al. | 156/643 |
| 5,262,610 | 11/1993 | Huang et al. | 219/121.43 |
| 5,389,153 | 2/1995 | Paranjpe et al. | 315/111.21 X |
| 5,489,362 | 2/1996 | Steinhardt et al. | 118/723 MW |
| 5,498,308 | 3/1996 | Kamarehi et al. | 156/343 |

FOREIGN PATENT DOCUMENTS

| | | |
|---|---|---|
| 2702328 | 9/1994 | France . |
| 2-107778 | 4/1990 | Japan . |
| 266106 | 11/1972 | U.S.S.R. . |

*Primary Examiner*—Justin P. Bettendorf
*Attorney, Agent, or Firm*—Pollock, Vande, Sande & Amernick, R.L.L.P.

[57] ABSTRACT

A plasma discharge device and method for removing material from a substrate having dynamic tuning, which permits operation with a variety of process gasses over a range of operating conditions. A longitudinally extending microwave cavity is defined at the ends by microwave traps, the positions of which are longitudinally adjustable to provide dynamic tuning. An adjustable antenna is provided, and operation utilizes the $TM_{012}$ mode.

12 Claims, 7 Drawing Sheets

PLASMA DISCHARGE DEVICE WITH DYNAMIC TUNING BY A MOVABLE MICROWAVE TRAP

BACKGROUND OF THE INVENTION

The present invention is directed to an improved plasma discharge device and method for removing material from a substrate.

In the manufacture of semiconductor devices, it is frequently necessary to remove a substance from a substrate. The present invention is broadly applicable to such processes, and for example, would include specific processes relating to residue removal, chemical downstream etching (CDE), and etching.

It is known to use plasma discharge devices to remove a substance from a substrate, and these may be of the "afterglow" type, where it is the afterglow of the plasma rather than the plasma itself which accomplishes removal. While the gas used in the plasma is frequently oxygen, as for ashing applications, it may be a different gas such as a fluorine containing gas for other applications, as when materials such as heavily metallized polymeric residues are to be removed.

In a plasma discharge device, a gas is flowed through a plasma tube which is located in a microwave cavity, and a plasma is excited in the gas by microwave energy. Then, the plasma, or the afterglow therefrom is used to remove the material from the substrate.

One drawback of many plasma discharge devices for material removal is that they are designed for use with only a single type of gas, e.g., oxygen, or fluorine containing gas, as the case may be. This results in added expense since, when a process using a different gas is to be performed, a new piece of equipment must be used.

SUMMARY OF THE INVENTION

In accordance with the present invention, a plasma discharge device is provided which may be used with different fill gases over a wide range of process conditions. This is accomplished by providing a device which is broadly tunable, so that an appropriate resonant microwave mode may be achieved even when different gases and different operating conditions are present.

The dynamic tuning of the present invention is achieved by defining at least one end of a longitudinally extending microwave cavity with a microwave trap, and arranging for the longitudinal position of the microwave trap to be adjustable. In a preferred embodiment of the invention, each end of the cavity is defined by a microwave trap, and the longitudinal positions of both traps are adjustable.

In accordance with a further aspect of the invention, the microwave power is coupled to the cavity with an antenna which extends into the cavity, the degree of insertion of which into the cavity is adjustable. This provides a further tuning adjustment, so that coupling of the desired microwave mode may be enhanced while the operating window is enlarged.

In accordance with a still further aspect of the invention, the cavity is excited with microwave power in the resonant cylindrical $TM_{012}$ mode. In a prior plasma discharge device, which provided microwave modes having azimuthal and longitudinal uniformity to prevent cracking of the plasma tube, it was necessary to separate the elongated microwave cavity into sections with metallic partitions to create sub-cavities which were small enough to support such modes. By providing an adjustable cavity length to excite the cylindrical $TM_{012}$ mode, the need for such cavity partitioning is avoided, while azimuthal uniformity and an adequate degree of longitudinal uniformity is provided.

BRIEF DESCRIPTION OF DRAWINGS

The invention will be better appreciated by referring to the drawings, wherein.

DETAILED DESCRIPTION OF PREFERRED EMBODIMENTS

Figure 1:
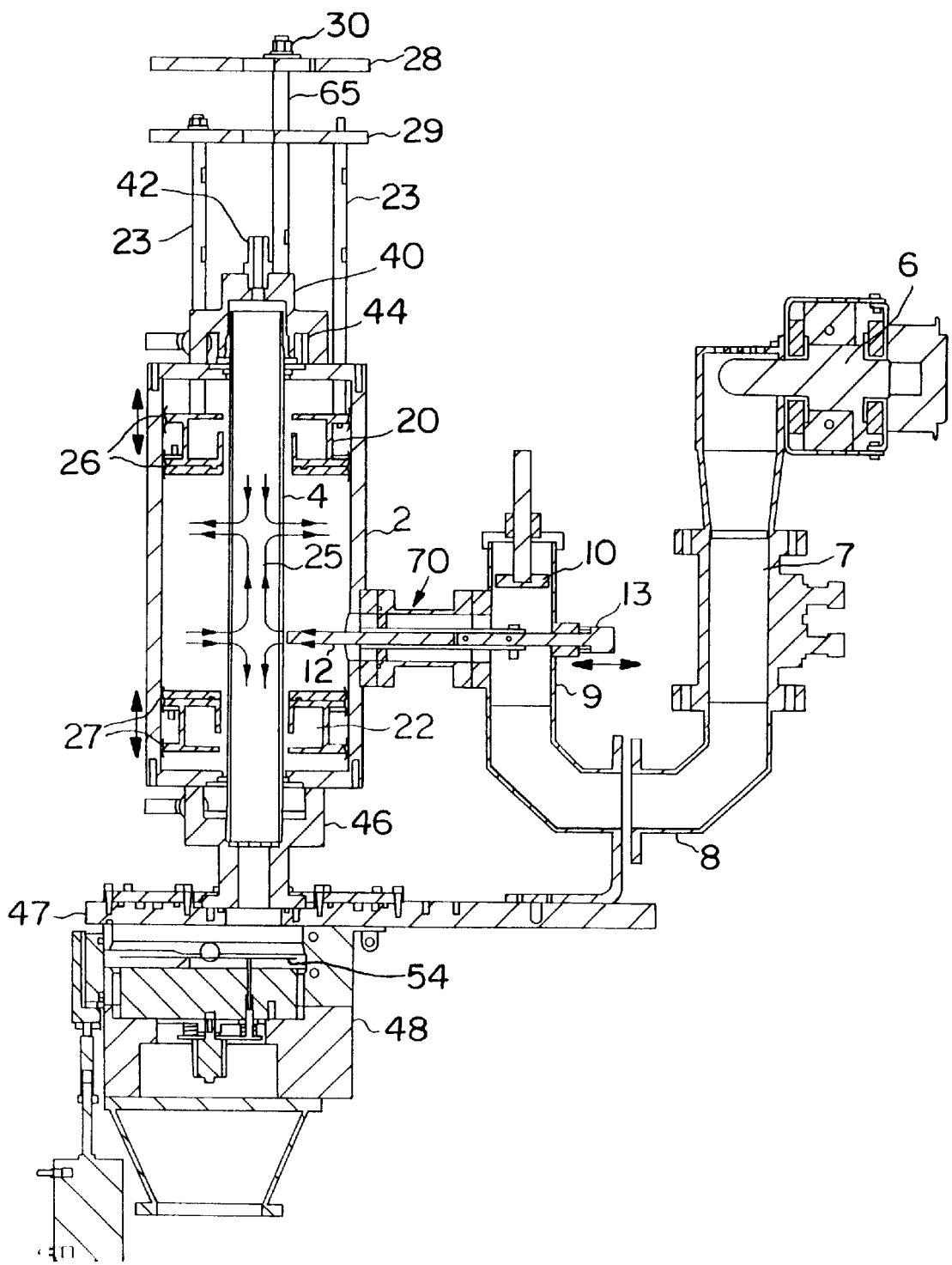
FIG. 1 is a cross-sectional view of a plasma discharge device.

Referring to the Figures, longitudinally extending cylindrical microwave cavity 2 is depicted, which has cylindrical plasma tube 4 running therethrough. The plasma tube may be made of quartz or sapphire, or other substance which is appropriate for the gas which is used.

In order to excite the gas flowing in plasma tube 4 to a plasma state, microwave excitation must be provided. To this end, microwave source 6, e.g., a magnetron, generates microwave power which is fed through directional coupler 7 to a waveguide having mutually perpendicular sections 8 and 9. The length of section 9 is controlled with moveable short 10, which may be a fixed rather than a moveable member if desired. An antenna 12 in the form of a metallic rod is provided for coupling microwave power from the waveguide to the cavity via a waveguide to coaxial transition. The antenna extends through a circular opening in the cavity wall into the cavity, and its degree of insertion is adjustable. The adjustment is accomplished by pushing or pulling on member 13 which is attached to antenna 12 with pin 15, thus causing antenna 12 to move in and out of the cavity. Member 13 is made of a low loss electrical insulator of low dielectric constant, e.g., polytetrafluorethylene, to prevent microwave leakage through the insertion hole. A screw mechanism including a stepping motor may be provided for automating the insertion and retraction of the antenna. As described above, the antenna adjustment allows the coupling of the field to the cavity to be optimized for specific operating conditions and increases the operating window of the system.

Figure 3:
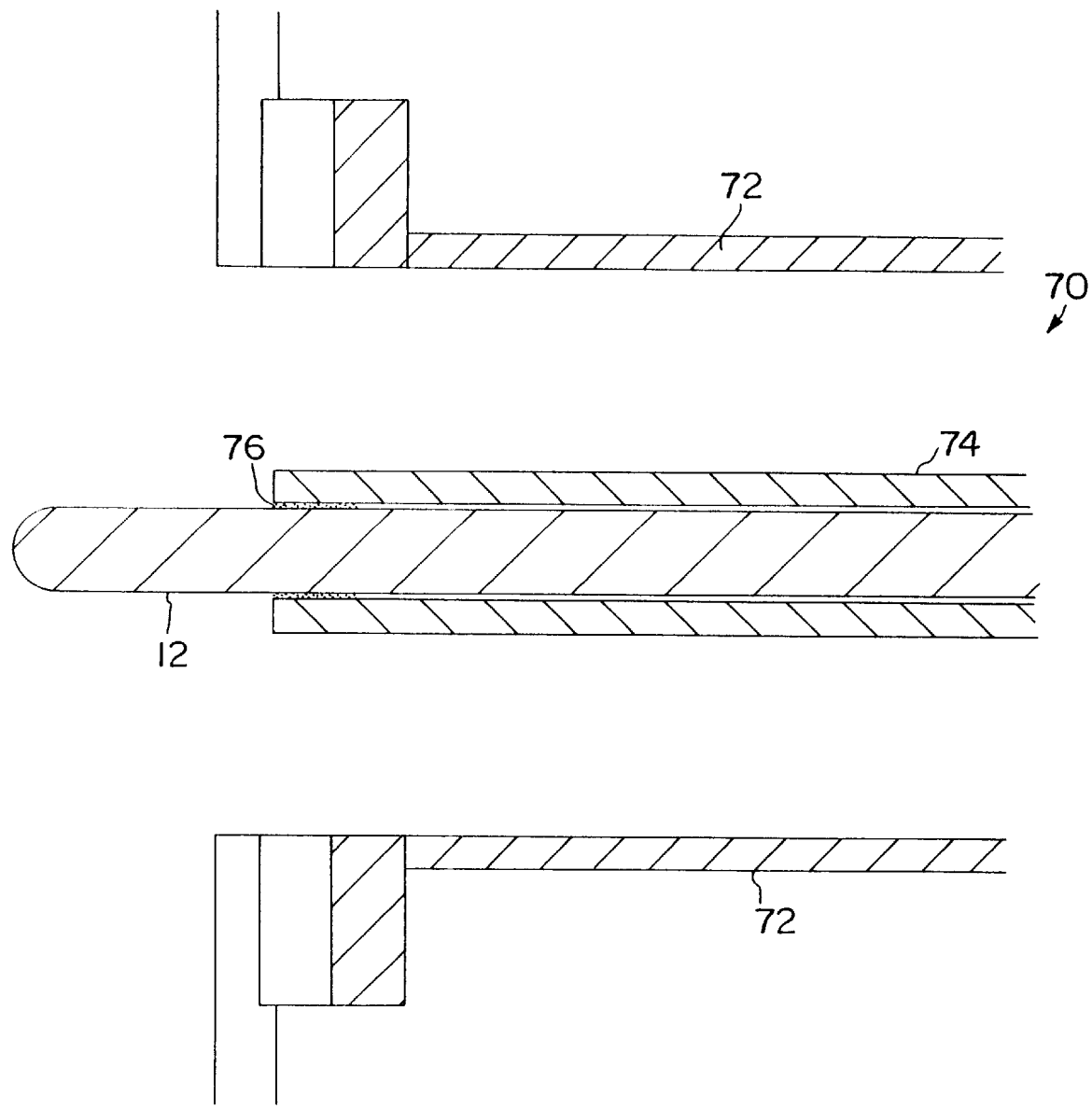
FIG. 3 shows the structure relating to the antenna configuration in greater detail.
Figure 4:
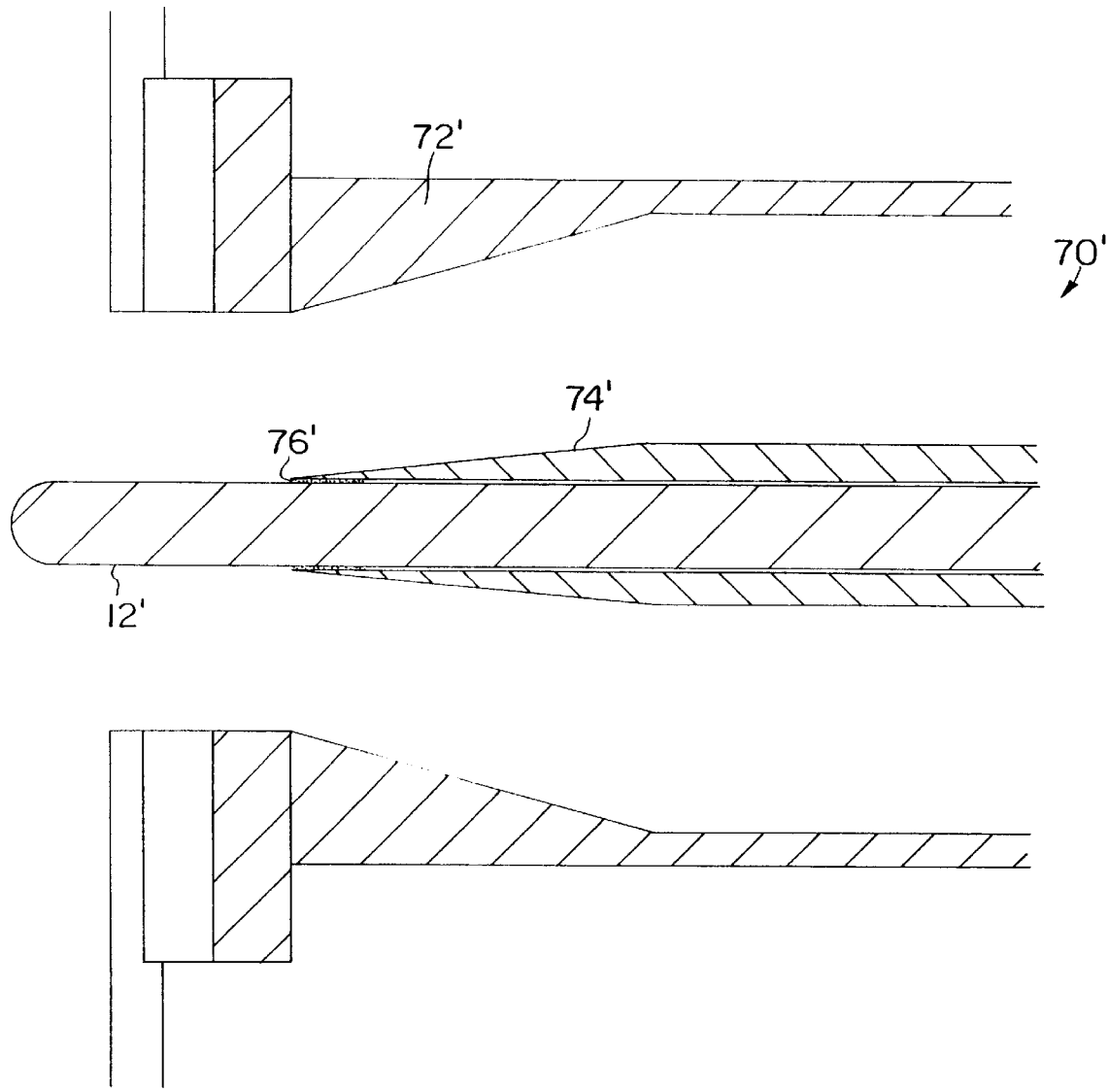
FIG. 4 shows alternative structure relating to the antenna configuration.

FIG. 3 is a detail of coaxial structure 70 shown in FIG. 1. The coaxial structure is comprised of outer conductor 72 and an inner conductor comprised of sleeve 74 and antenna 12 which slides in sleeve 74 with the aid of finger stock contact ring 76. An alternative embodiment is shown in FIG. 4, wherein like parts are identified with the same numerals. In FIG. 4, coaxial structure 70' is comprised of outer conductor 72' and an inner conductor comprised of sleeve 74' and antenna 12' which slides therein. In the embodiment of FIG. 4, the inner surface of outer conductor 72' and the outer surface of sleeve 74' are tapered so as to provide a gradual change in impedance, thereby providing better impedance matching between the waveguide 9 and the cavity 2.

The ends of the microwave cavity are defined by microwave traps 20 and 22. Such traps are a very effective way of preventing microwave leakage since they electrically reduce the microwave current to zero. The traps may be of the type disclosed in U.S. Pat. No. 5,498,308, the entire disclosure of which is incorporated herein by reference.

Each microwave trap is a resonant circuit in which the microwave current is reduced to zero.

Figure 5:
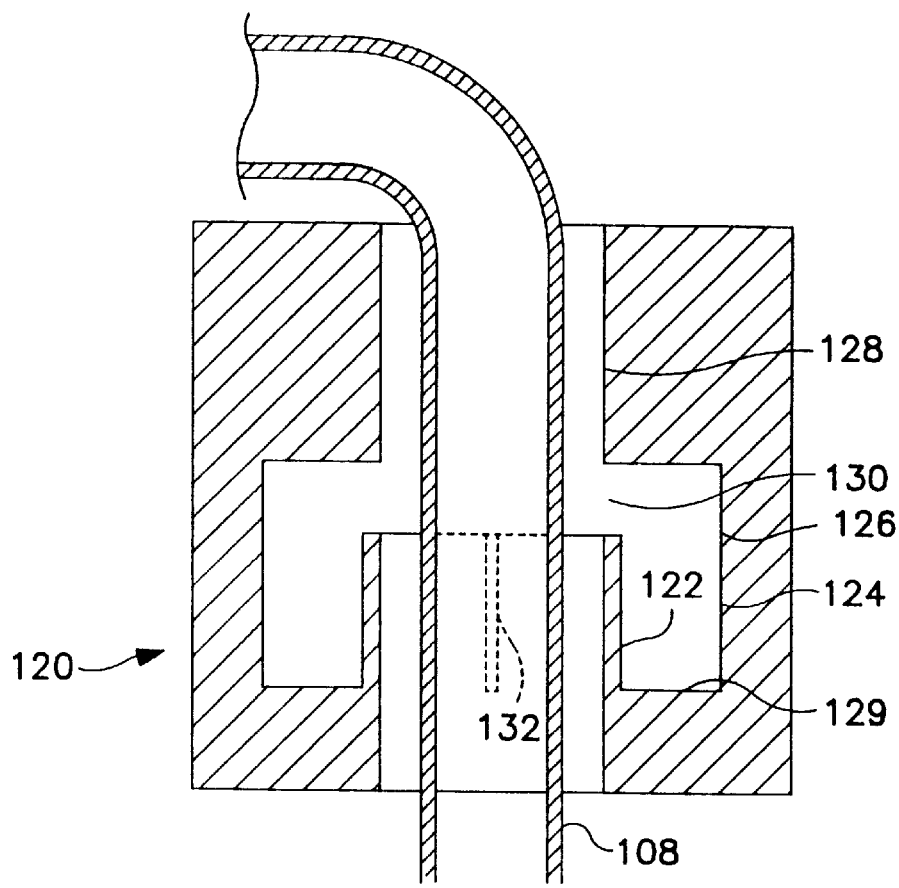
FIG. 5 is a cross-sectional view of a microwave trap.

Referring to FIG. 5, an embodiment of such a microwave trap is depicted by reference number 120. The trap is a coaxial device, and has inner and outer cylindrical conductors 122 and 124, respectively, through which plasma tube 108 passes. It is noted that there is a gap 130 between inner conductor 122 and portion 128 of the outer conductor. Portion 129 abuts the side of microwave enclosure 104.

Figure 6:
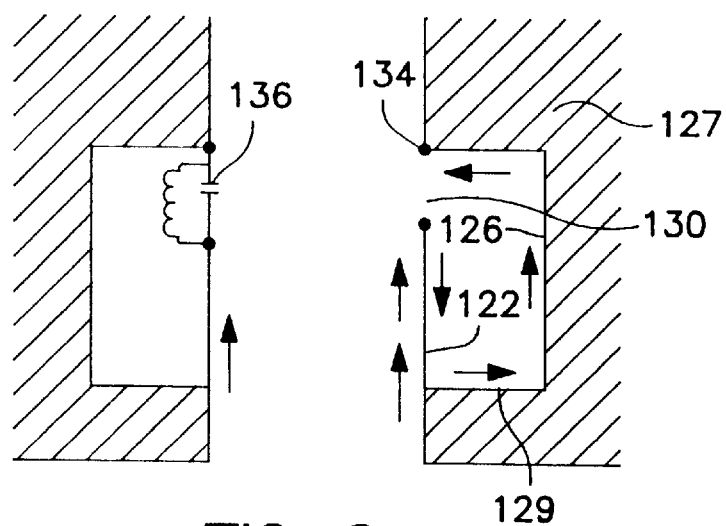
FIG. 6 shows an equivalent distributed circuit for the device of FIG. 5.

Microwave trap 120 is effective to reduce the microwave current to zero in the trap, thus indicating that there is no microwave field. Referring to FIG. 6 the current path in the device is depicted, and an equivalent distributed circuit is represented. It is seen that the current begins on the inside of the inner conductor 122, turns around the top of the inner conductor, and travels down the outside of the inner conductor. It then travels across part 129 and up the inside of outer conductor portion 126. It travels across outer conductor part 127, and then stops, that is, falls to zero at point 134. Thus, there is no current in portion 128 of the outer conductor. The equivalent distributed circuit of the device is shown at reference number 136, and is depicted as a parallel LC circuit. The inductance L results from the impedance of the short circuited coaxial line (by part 129), while the capacitance C is the capacitance across the gap or open circuit 130. In order to cause the current at point 134 to fall to zero, the dimensions of the device are adjusted so that the LC circuit is resonant. It is noted that the long dimension of the outer conductor is about ¼ wavelength. Also, it is noted that the inner conductor contains four lengthwise slits 132 which are located 90° apart, the purpose of which is to interrupt circumferentially directed currents which may tend to flow on the inner conductor.

Figure 7:
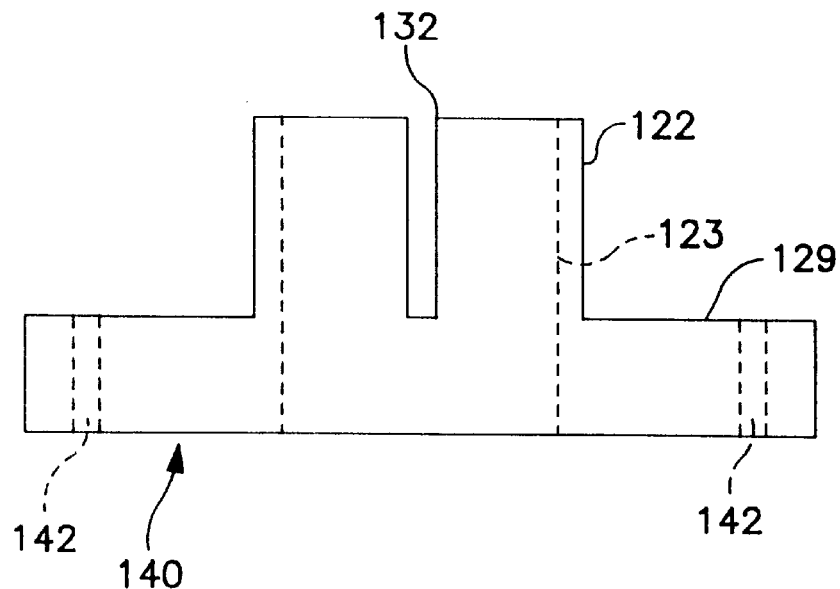
FIGS. 7 and 8 show the part that forms the inner conductor of the coaxial device shown in FIG. 5.
Figure 8:
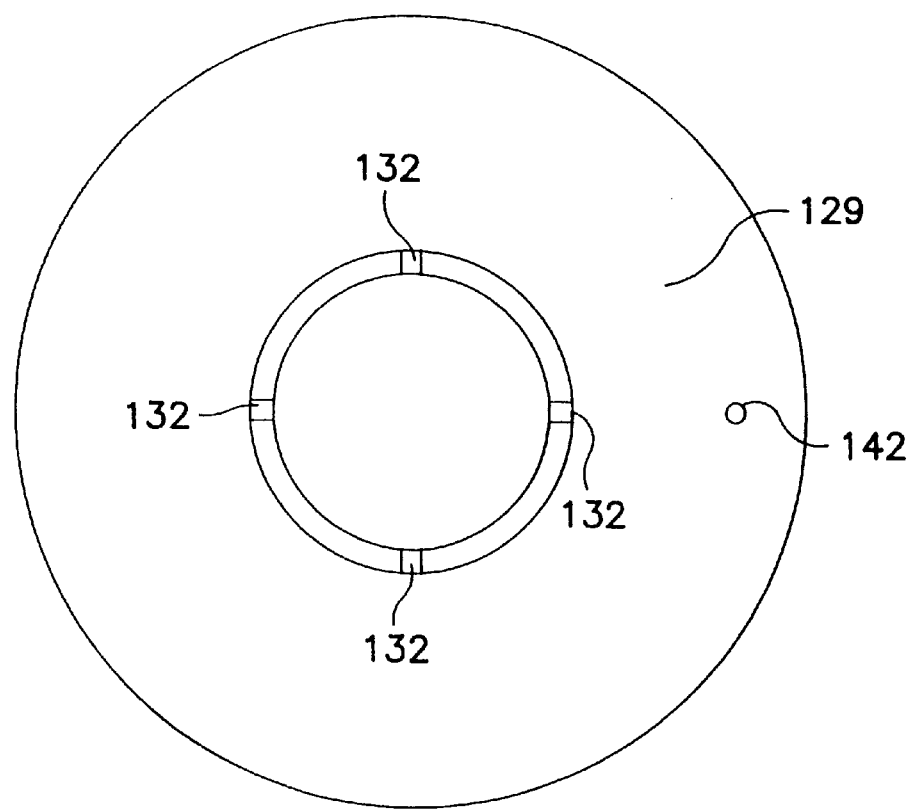

Referring to FIG. 7, the inner conductor piece 140 is shown. This is secured to the side of microwave enclosure 104 by screws in holes 142. The thickness of the inner cylinder is represented by the distance between line 123 and the parallel solid line outside such dotted line. The positioning of the lengthwise slits 132 are clearly shown in the plan view of FIG. 8.

Figure 9:
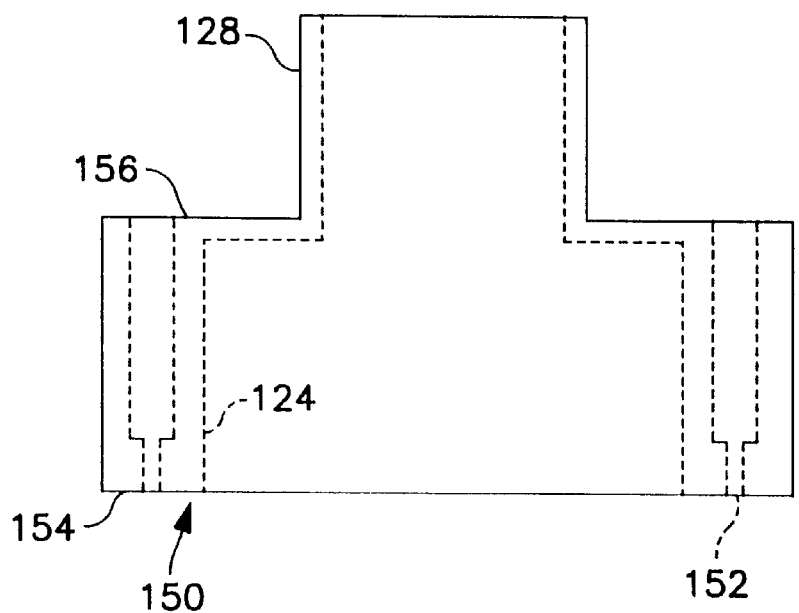
FIGS. 9 and 10 show the part that forms the outer conductor of the coaxial device shown in FIG. 5.
Figure 10:
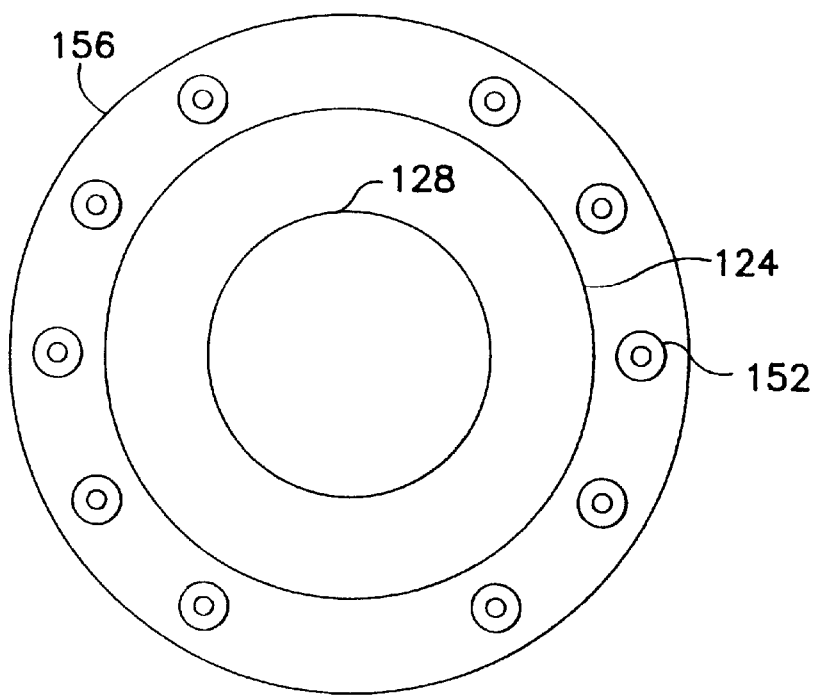

FIGS. 9 and 10 show the outer conductor piece 150 of the coaxial structure. The thickness of the coaxial cylinder is the distance between the inner dotted line and the parallel solid line which is exterior to the dotted line.

Piece 150 is secured to piece 140 by placing surface 154 of the piece 159 flush with part 129 of piece 140, and inserting screws in holes 152 of piece 150 and holes 142 of piece 140.

It is noted that the diameters of the inner and outer conductors across the gap are about the same.

In accordance with an aspect of the present invention, the longitudinal position of microwave traps 20 and 22 is adjustable. For example, the adjustment may be facilitated by disposing finger stock 26 and 27 between the traps and the cavity wall, which are compressible protrusions, thus rendering the microwave traps longitudinally slidable.

Figure 2:
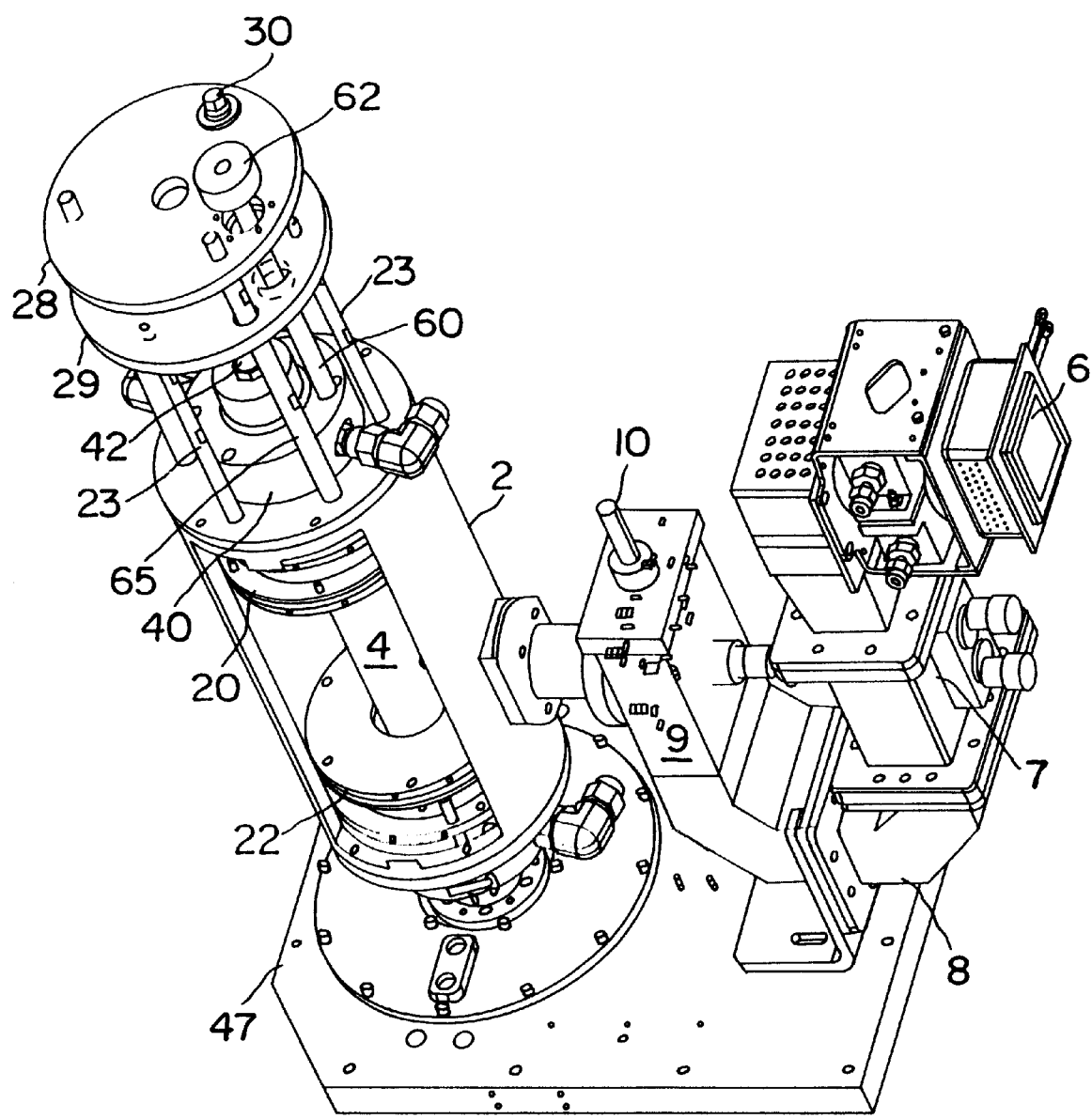
FIG. 2 is a perspective view with partial cutaway, of the plasma discharge device of FIG. 1.

Additionally, a screw mechanism may be provided for conveniently effecting the adjustment of the traps, and such a mechanism is shown in connection with the top trap 20 in the FIGS. 1 and 2. It is comprised of horizontal (in the Figures) members 28 and 29, and vertical (in the Figures) cylindrical members 23, 65, and 60. There are three members 23, (not all shown) which connect the top of top trap 20 to member 29. There are three members 65, (not all shown) which connect the top of the microwave cavity to member 28, where they are secured with nuts 30 (only one shown). Member 60 is threaded, as is an opening in member 29 through which in turn raises or lowers the microwave trap 20. If desired a stepper motor may be employed in a configuration for automating the raising and lowering of the trap. A similar mechanism (not shown) can be employed for moving the bottom trap 22.

The adjustment of the cavity length provides a broad range of dynamic cavity tuning, and is what permits the device to be operated with different gasses over a wide range of process conditions. As is known to those skilled in the art, utilizing a different gas will change the load impedance and resonant frequency of the cavity, and effectively of the cavity, thereby detuning it. Re-tuning may be accomplished by experimenting with the positions of the slidable traps to establish a resonant $TM_{012}$ mode in the cavity. That is, the cavity is nominally dimensioned to result in the $TM_{012}$ mode, and the dynamic tuning permits resonance to be maintained over a variety of process gasses. In addition to the use of different gasses, a broad range of process conditions, e.g., gas flow, pressure, input power, etc. can be accommodated.

While the invention is operable by making the position of only one trap adjustable, a big advantage is afforded when both traps are moveable. This is because the position of each trap may be independently changed in relation to the position of the antenna, thus affording a greater range of effective tuning.

The device may be air cooled by providing a quartz tube close to and concentric with plasma tube 4, and feeding pressurized air in the space between the tubes, or if desired, may be liquid cooled with a high specific heat liquid that is microwave transparent and clean room friendly by feeding such substance between the concentric tubes.

Referring to FIG. 1, it is seen that end cap 40 is provided which abuts the top of the cavity, while fitting 42 having a central orifice for admitting gas to the plasma tube extends into the end cap. The plasma tube is supported at this end by O ring 44 in the end cap. End member 46 is provided at the other end to provide the proper spacing in relation to bottom plate 47 and the process chamber 48, while this end of the plasma tube has an opening in it for emission into the process chamber.

In the operation of the device, oxygen, fluorine containing gas, or other gas is fed into gas inlet 42, which feeds plasma tube 4. The microwave cavity is tuned to achieve a resonant $TM_{012}$ mode by adjusting the position of slidable microwave traps 20 and 22, and matching of the cavity impedance with plasma to the characteristic impedance of the coaxial section is accomplished by adjusting the insertion of antenna 12 into the cavity. A plasma is excited in the gas, the afterglow of which is emitted from an opening at the end of the plasma tube into process chamber 48. While the invention is applicable to devices where either the plasma or the afterglow from the plasma is used to remove material, the preferred embodiment is an afterglow device.

The $TM_{012}$ field configuration is depicted in FIG. 1 at reference numeral 25. To prevent cracking of a sapphire plasma tube, it is necessary to prevent unequal heating of the tube, and a field configuration having azimuthal and longitudinal uniformity will accomplish this. The $TM_{012}$ field has azimuthal uniformity (not shown), and as seen in FIG. 1 also has adequate longitudinal uniformity. Thus, it has been found that use of the $TM_{012}$ field configuration obviates cracking of the plasma tube, and as mentioned above, does not require a cavity which uses partitioning.

The process chamber 48 includes retractable wafer support pins which support wafer 54, to be processed. A chuck is aranged to provide is for providing the correct heating to the wafer during processing. One or more baffle plates may be present above the wafer to promote even distribution of the gas.

In an actual embodiment which was built, the magnetron frequency was 2443 Mhz, the microwave cavity had an internal diameter of 5.43 inches and was approximately 8.25 inches long with the microwave traps positioned to make the cavity as long as possible. The top microwave trap could be moved to shorten the cavity by about 3.5 inches, while the bottom trap could be so moved by about 0.5 inch. In use for removing polymeric residues, a plasma tube made of sapphire was used having an ID of 1.37 inches and a fluorine containing gas was flowed through the tube. The microwave power was about 2000 watts and the power density was about 11.8 watts/cc.

It should be understood that while the invention has been described in connection with illustrative embodiments, variations will occur to those skilled in the art, and the scope of the invention is to be limited only by the claims which are appended hereto and equivalents.

We claim:

1. A dynamically tunable plasma discharge device for removing material from a substrate, comprising a longitudinally extending microwave cavity, a plasma tube passing through said microwave cavity for containing gas when in operation, means for providing a microwave field in said cavity for exciting gas when in said plasma tube to a plasma, an opening in said plasma tube for permitting said gas to exit, at least one end of said microwave cavity being defined by a microwave trap, the position of which is longitudinally adjustable to provide dynamic tuning of said cavity, said microwave trap comprising a resonant circuit in which the microwave current is reduced to zero.

2. The device of claim 1 wherein both ends of said microwave cavity are defined by microwave traps and the respective positions of both microwave traps are longitudinally adjustable to provide dynamic tuning of said cavity.

3. The device of claim 2 wherein said means for providing a microwave field in said cavity comprises microwave source means for providing microwave power and means for coupling said microwave power from said source means to said cavity, wherein said means for coupling includes an antenna which extends into said cavity, the degree of insertion of which into said cavity is adjustable.

4. The device of claim 3 wherein said means for providing a microwave field in said cavity provides a field having a resonant cylindrical $TM_{012}$ mode.

5. The device of claim 4 wherein said gas may be selected from a plurality of gases including oxygen containing gas and fluorine containing gas.

6. The device of claim 5 further including means for utilizing said plasma or the afterglow therefrom to remove said material from said substrate.

7. The device of claim 1 wherein said microwave trap has a central opening through which said plasma tube passes and has inner and outer cylindrical conductors having cylindrical symmetry with respect to said plasma tube.

8. The device of claim 7 wherein the length of the outer conductor is about ¼ wavelength.

9. The device of claim 8 wherein the outer conductor is longer than the inner conductor.

10. The device of claim 9 wherein the diameter of the outer conductor becomes smaller towards the outer end.

11. The device of claim 10 wherein the diameter of the outer conductor becomes smaller abruptly, so that the outer conductor is comprised of a first portion of relatively larger diameter and a second portion of relatively smaller diameter, and wherein the second portion of the outer conductor is about co-linear with the inner conductor but is separated therefrom by a gap.

12. A plasma discharge device for removing material from a substrate, which is dynamically tunable for use with different gases over a range of process conditions, comprising a longitudinally extending microwave cavity, a plasma tube passing through said cavity, means for providing gas to said plasma tube, means for providing a microwave field having a resonant $TM_{012}$ mode in said cavity which includes an antenna extending into said cavity the degree of insertion of which into said cavity is adjustable, for exciting said gas to a plasma, at least one end of said longitudinally extending cavity being defined by a microwave trap, the longitudinal position of which is adjustable to provide dynamic tuning of the cavity, the microwave trap being a resonant circuit in which the microwave current is reduced to zero.

\* \* \* \* \*